(12) United States Patent
Harris et al.

(10) Patent No.: US 9,935,604 B2
(45) Date of Patent: Apr. 3, 2018

(54) VARIABLE BANDWIDTH FILTERING

(71) Applicant: Xilinx, Inc., San Jose, CA (US)

(72) Inventors: Fredric J. Harris, San Diego, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 273 days.

(21) Appl. No.: 14/791,852

(22) Filed: Jul. 6, 2015

(65) Prior Publication Data

US 2017/0012598 A1  Jan. 12, 2017

(51) Int. Cl.
| | |
|---|---|
| H03K 9/10 | (2006.01) |
| H04L 27/22 | (2006.01) |
| H03H 7/12 | (2006.01) |
| H03H 17/02 | (2006.01) |

(52) U.S. Cl.
CPC .......... H03H 7/12 (2013.01); H03H 17/0266 (2013.01)

(58) Field of Classification Search
None
See application file for complete search history.

(56) References Cited

U.S. PATENT DOCUMENTS

| | | |
|---|---|---|
| 8,959,510 B2 | 2/2015 | Harris |
| 2004/0042557 A1 | 3/2004 | Kabel et al. |
| 2010/0091777 A1* | 4/2010 | Cannon ................. H04L 1/0071 370/392 |
| 2014/0169501 A1* | 6/2014 | Nazarathy .......... H03H 17/0266 375/316 |
| 2014/0310011 A1* | 10/2014 | Biswas ................... G10L 25/54 704/500 |
| 2016/0163305 A1* | 6/2016 | Lee ...................... G10K 11/178 381/71.4 |

OTHER PUBLICATIONS

Harris, Fred et al., "Interleaving Different Bandwidth Narrowband Channels in Perfect Reconstruction Cascade Polyphase Filter Banks for Efficient Flexible Variable Bandwidth Filters in Wideband Digital Transceivers," Proc. of the 2015 IEEE International Conference on Digital Signal Processing, Jul. 24, 2015, pp. 1111-1116, IEEE, Piscataway, New Jersey, USA.

(Continued)

*Primary Examiner* — Shuwang Liu
*Assistant Examiner* — Gina McKie
(74) *Attorney, Agent, or Firm* — W. Eric Webostad; David O'Brien

(57) ABSTRACT

An apparatus, and related method, relates generally to viable bandwidth filtering. In such an apparatus, an analysis filter bank has path filters associated with different bandwidths and is configured for filtering and transforming an input signal having a first bandwidth into a first interleaved output. A mask is coupled to the analysis filter bank and configured for masking at least one narrowband time signal of the first interleaved output. A synthesis filter bank is coupled to the mask. The synthesis filter bank is configured for transforming and filtering the masked first interleaved output to generate a second interleaved output for constructing an output signal having a second bandwidth. The second bandwidth is different than the first bandwidth for the variable bandwidth filtering.

20 Claims, 5 Drawing Sheets

(56) References Cited

OTHER PUBLICATIONS

Harris, Fred et al., "Multi-Resolution PR NMDFBs for Programmable Variable Bandwidth Filter in Wideband Digital Transceivers," Proc. of the 19th International Conference on Digital Signal Proessing, Aug. 20, 2014, pp. 104-109, IEEE, Piscataway, New Jersey, USA.
Harris, Fred, "Selectable Bandwidth Filter Formed from Perfect Reconstruction Polyphase Filter Bank," Proc. of the 2010 IEEE 44th Asilomar Conference on Signals, Systems and Computers, Nov. 7, 2010, pp. 1292-1296, IEEE, Piscataway, New Jersey, USA.
Vaidyanathan, P. P., "Multirate Digital Filters, Filter Banks, Polyphase Networks, and Applications: A Tutorial," Proc. of the IEEE, Jan. 1990, vol. 78, No. 1, pp. 56-93, IEEE, Piscataway, New Jersey, USA.
Harris, Fred et al., "Multi-Resolution PR NMDFBs for Programmable Variable Bandwidth Filter in Wideband Digital Transceivers," Proc. of the 2014 19th Conference on Digital Signal Processing, Aug. 20, 2014, pp. 104-109, IEEE, Piscataway, New Jersey, USA.
Specification and drawings for U.S. Appl. No. 14/791,811, filed Jul. 6, 2015.

\* cited by examiner

VARIABLE BANDWIDTH FILTERING

TECHNICAL FIELD

The following description relates to integrated circuit devices ("ICs"). More particularly, the following description relates to a variable bandwidth filtering for an IC.

BACKGROUND

Multirate signal processing is used in many signal processing systems. In some multirate signal processing applications, an input bandwidth may be larger than a target output bandwidth. In the past, a conventional multi-tap filter, such as a Finite Impulse Response ("FIR") filter with a substantially higher sample rate than filter bandwidth, was used to filter an input bandwidth wider than such filter bandwidth to provide a channelized band for such output bandwidth. Unfortunately, such a multi-tap filter conventionally comes with a substantial amount of overhead, such as a multiply operation for each tap, and this may be problematic particularly for wideband applications. Along those lines, there may be hundreds or thousands of taps needed to provide a specified performance.

Hence, it would be desirable and useful to provide greater flexibility in forming a composite bandwidth of a filter for multirate signal processing applications, including without limitation wideband digital signal processing applications.

SUMMARY

An apparatus relates generally to viable bandwidth filtering. In such an apparatus, an analysis filter bank has path filters associated with different bandwidths and is configured for filtering and transforming an input signal having a first bandwidth into a first interleaved output. A mask is coupled to the analysis filter bank and configured for masking at least one narrowband time signal of the first interleaved output. A synthesis filter bank is coupled to the mask. The synthesis filter bank is configured for transforming and filtering the masked first interleaved output to generate a second interleaved output for constructing an output signal having a second bandwidth. The second bandwidth is different than the first bandwidth for the variable bandwidth filtering.

An apparatus relates generally to variable bandwidth filtering. In such an apparatus, a first channelizer is configured for receiving an input signal having a first bandwidth and configured for filtering and transforming the input signal for generating an interleaved output with at least one component thereof masked. The interleaved output has different bandwidths therein. A second channelizer, cascaded with the first channelizer, is configured for transforming and filtering the interleaved output masked and constructing an output signal therefrom. The output signal has a second bandwidth different from the first bandwidth for the variable bandwidth filtering.

A method relates generally to variable bandwidth filtering. In such a method, an input signal having a first bandwidth is received by a first channelizer, and an interleaved output having different bandwidths therein is generated. At least one component of the interleaved output is masked. The interleaved output with the at least one component masked is received by a second channelizer, and an output signal having a second bandwidth is constructed therefrom. The second bandwidth is different from the first bandwidth. The output signal is output.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
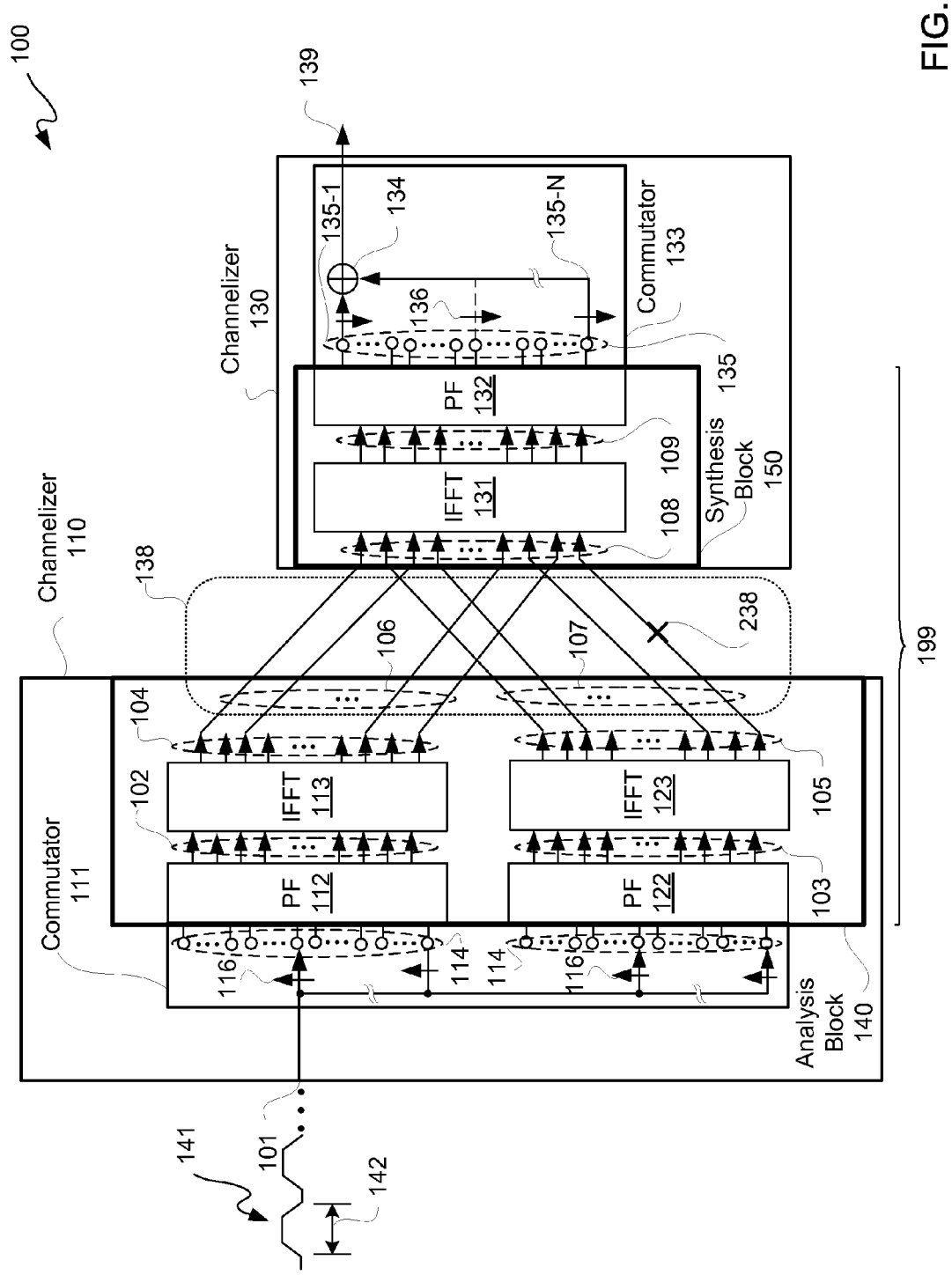
FIG. 1 is a block diagram depicting an exemplary variable bandwidth filter for signal processing.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Rather than using a conventional multi-tap filter, a polyphase filter bank ("polyphase filter") and an Inverse Fourier Transform ("IFT") block may be used to channelize a signal. Along those lines, a maximally decimated polyphase transform may divide a signal into M subbands. Accordingly, an analysis filter bank may channelize an input signal into M equally spaced and equal bandwidth subband channels, and then a subset K of such M equal subband channels may be used to reconstruct a composite wideband channel using a polyphase transform synthesis filter bank. However, to avoid aliasing, amplitude distortion, and/or phase distortion, such a reconstruction conventionally has to be exact. This exact reconstruction is known as a "Perfect Reconstruction" or "PR."

In some instances, a target output bandwidth may not exactly align with a desired output bandwidth, which may make reconstruction without significant aliasing, amplitude distortion and/or phase distortion problematic. Along those lines, a polyphase filter bank, or a polyphase filter of a polyphase transform, may be insufficiently granular for such a signal processing application.

An analysis filter bank, which may be realized as an M1-path filter and a sampled data Fourier transform, namely an M1-path polyphase filter and an M1-point Inverse Discrete Fourier Transform ("IDFT"), and a synthesis filter bank, which may be realized as an M2-point IDFT and an M2-path polyphase filter, may be used to combine K subfilters to provide a single filter with a desired composite output bandwidth. M2, namely an integer number of paths of an output synthesis filter bank, may be equal to, less than or greater than M1, namely an integer number of paths of an input synthesis filter bank. The ratio M2/M1 of an application may match the ratio of output sample rate from a synthesis filter bank to an input sample rate of analysis filter bank.

An analysis filter bank may use non-maximally decimation of an input signal into subbands of equal and equally spaced bands for reconstruction of an output signal by a synthesis filter bank using such subbands. Unfortunately, if a target output bandwidth does not exactly align with outer edges of the two outermost subbands of such non-maximally decimated subbands, or align with outer edges of the two outermost subbands of a subset of such non-maximally decimated subbands, for example an outermost negative subband and an outermost positive subband corresponding to a passband of such target output bandwidth, a resultant filter formed by K assembled subbands may not satisfy a filter design constraint therefor.

However, in a co-pending U.S. patent application entitled, "Path Filter with Outer and Inner Polyphase Transforms for Passband Bandwidth Adjustment," by a co-inventor hereof and commonly assigned or obligated to assign to an assignee hereof, application number 14/791,811, filed 07/06/2015, which is incorporated by reference herein in its entirety for all purposes to the extent same is consistent herewith, this misalignment of input bandwidth to an output bandwidth is addressed by addition of inner analysis and inner synthesis banks between an outer analysis bank and an outer synthesis bank. However, this addition of inner analysis and inner synthesis banks adds delay into a signal processing chain, and some applications may not be able to tolerate such additional delay.

As described below in additional detail, rather than having equally sized subbands, subbands of different bandwidths are generated for interleaving with one another. By adjusting how much or little to subtract or add to complementary bands, outer edges of bands of a reconstructed signal may exactly align to a passband of an output signal. Accordingly, a variable bandwidth path filter, such as described below in additional detail, may be used in signal processing applications, including without limitation multirate signal processing applications.

With the above general understanding borne in mind, various configurations for variable bandwidth filtering are generally described below.

Figure 2:
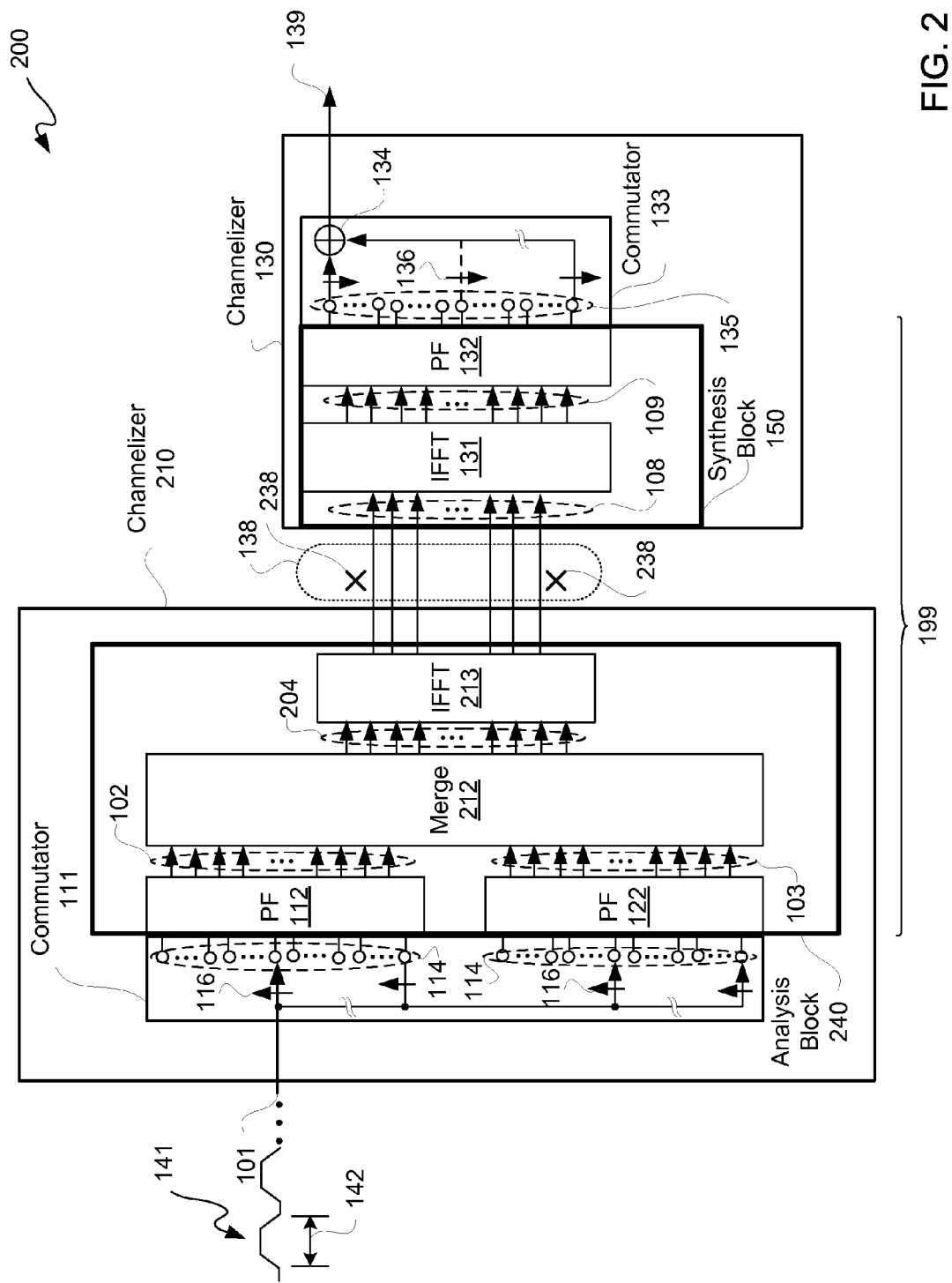
FIG. 2 is a block diagram depicting another exemplary variable bandwidth filter for signal processing.

FIG. 1 is a block diagram depicting an exemplary variable bandwidth filter 100 for signal processing. FIG. 2 is a block diagram depicting another exemplary variable bandwidth filter 200 for signal processing. Variable bandwidth filters 100 and 200 are described below in additional detail with simultaneous reference to FIGS. 1 and 2. Generally, variable bandwidth filters 100 and 200 may be used for digital signal processing applications. Such digital signal processing applications may include transmission and/or reception of data. Moreover, such variable bandwidth filters 100 and 200 may be used in wideband digital transmitters, receivers, and/or transceivers.

Variable bandwidth filters 100 and 200 may respectively include an analysis block 140 and an analysis block 240. Analysis blocks 140 and 240 as described herein may include pairs of analysis filters and one or more IDFTs. However, more generally, analysis blocks 140 and 240 may be respective analysis filter banks.

Input signal 101 may be a composite signal, such as a multi-carrier or multi-band signal. Moreover, input signal 101 may be a composite signal for a multirate application. For purposes of clarity and not limitation, it shall be assumed that input signal 101 has a passband 141 having an input bandwidth 142. Because variable bandwidth filters 100 and 200 may be adjusted for different output bandwidths, such variable bandwidth filters may be suitable for arbitrary bandwidth multirate applications.

Analysis blocks 140 and 240 each include at least two M1-path filters, namely path filter ("PF") 112 and PF 122, for filtering input signal 101 into at least two sets of subintervals or subbands, generally filtered samples. In this example, sets of filtered samples or sets of subintervals or sets of time subbands 102 and 103 may be respectively output from PFs 112 and 122.

Variable bandwidth filters 100 and 200 each operate in the time domain, and so example intervals and subintervals are described below in additional detail. However, it may be easier to understand operation of variable bandwidth filters 100 and 200 from the standpoint of their frequency domain descriptions, and so example bands and subbands are described below as well.

PF 112 and PF 122 are associated with different output bandwidths for providing an interleaved output 108 from variable bandwidth filters 100 and 200. Interleaved output 108 may or may not have an overall bandwidth equal to input bandwidth 142, as described below in additional detail.

In this example implementation, analysis block 140 includes at least two IDFT blocks 113 and 123 corresponding to at least two path filters. In contrast to analysis block 140, analysis block 240 includes a merge block 212 and a single IDFT block 213 for all path filters of analysis block 240. In these examples, IDFT blocks of analysis block 140 are implemented as Inverse Fast Fourier Transform ("IFFT") blocks 113 and 123 corresponding to PF 112 and PF 122, and an IDFT block of analysis block 240 is implemented as an IFFT block 213 for both of PFs 112 and 122.

Analysis blocks 140 and 240 may respectively be of channelizers 110 and 210. Each of channelizers 110 and 210 may include an input commutator 111. Commutator 111 may be coupled for receiving input signal 101 for commutating to input ports 114 of PFs 112 and 122. Along those lines, commutator 111 may have an input sample rate, as generally indicated with up-arrows 116, for commutating input signal 101 to input ports 114 respectively of PFs 112 and 122. In this example, a sample rate of an output commutator 133, as generally indicated by arrows 136, is the same as the sample rate of input commutator 111. However, in other implementations, these input and output sample rates may be different, such as for overall upsampling or downsampling by variable bandwidth filters 100 and 200.

PF 112 is configured for filtering with a first band for providing filtered samples or subintervals 102 associated with frequency components of a passband 141 and for channelizing filtered samples 102 into channels respectively associated with such frequency components of such passband 141.

PF 122 is configured for filtering with a second band for providing filtered samples or subintervals 103 associated with frequency components of passband 141 and for channelizing filtered samples 103 into channels respectively associated with such frequency components of such passband 141. In this example, a filtering band or bandwidth of PF 112 is narrower than a filtering band or bandwidth of PF 122.

Along those lines, channelizers 110 and 210 may be configured to permit channel crossover frequencies to be at locations other than frequencies midway between equally spaced apart adjacent channel center frequencies. In order to have such a crossover frequency shift from a nominal midpoint position, internal bandwidths of such channelizers 110 and 210 are not all uniform. Accordingly, adjacent channel center frequencies may still be equally spaced apart from one another; however, crossover frequencies of such adjacent channels are not located at midpoints of such adjacent channel center frequencies.

In the examples described hereinbelow, bandwidth of channel filters of PF 112, including without limitation even indexed channel filters thereof, are decreased by an amount generally denoted as $\beta$ or $(1-\beta)$, and bandwidth of channel filters of PF 122, including without limitation odd indexed channel filters thereof, are increased by the same amount generally denoted as $\beta$ or $(1+\beta)$. In another implementation, bandwidth of channel filters of PF 112, including without limitation even indexed channel filters thereof, may be increased by an amount generally denoted as $\beta$ or $(1+\beta)$, and bandwidth of channel filters of PF 122, including without limitation odd indexed channel filters thereof, may be decreased by the same amount generally denoted as $\beta$ or $(1-\beta)$.

Figure 3:
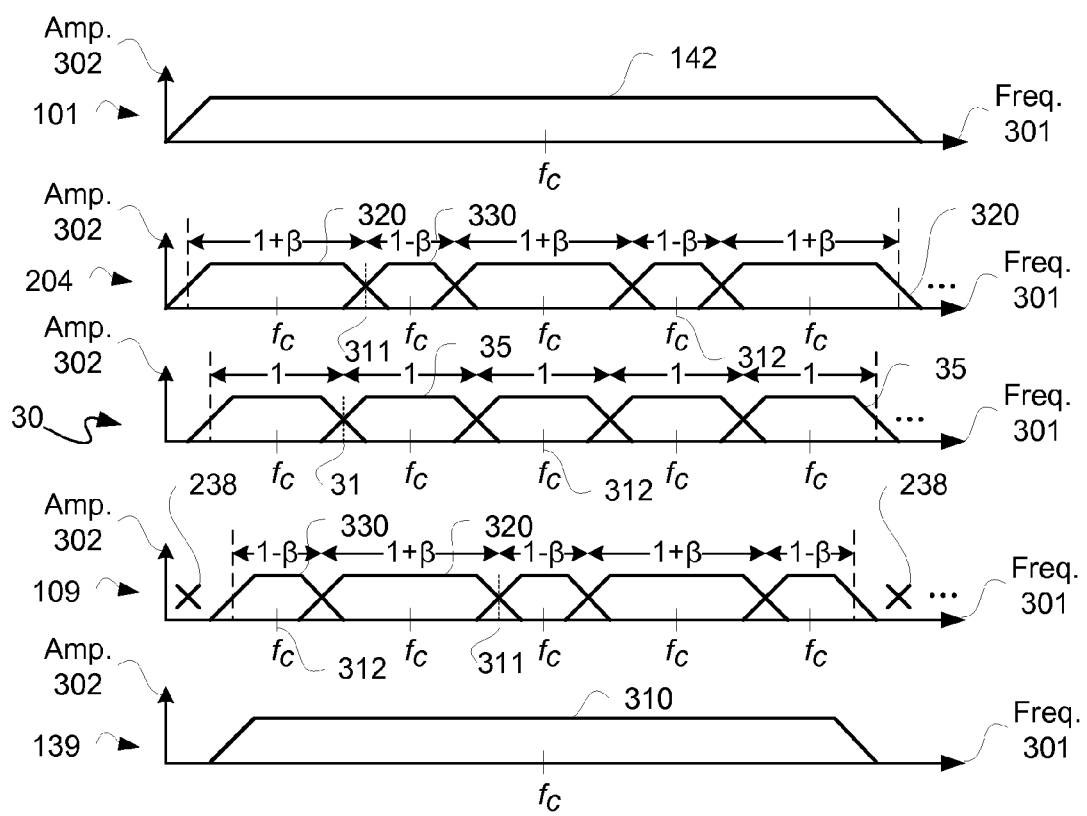
FIG. 3 is a diagram of frequency versus amplitude depicting various exemplary adjacent narrow bandwidth channels covering a wide bandwidth frequency span.

Along those lines, with reference to FIG. 3, there are shown diagrams of frequency 301 versus amplitude 302 depicting various exemplary channel spectra in accordance with the description herein, as well as a conventional spectrum 30 for purposes of contrast. For purposes of clarity, these spectra are illustratively depicted in the frequency domain even though variable bandwidth filters 100 and 200 operate in the time domain. With simultaneous reference to FIGS. 1 through 3, the examples of spectra of FIG. 3, as well as variable bandwidth filters 100 and 200 respectively of FIGS. 1 and 2, are further described.

An input signal 101 may have a bandwidth 142 which is wider than a bandwidth 310 of an output signal 139 of variable bandwidth filters 100 and 200. For purposes of comparison, a conventional partitioned spectra 30 of equal bandwidth subbands 35 with midpoint crossovers 31 and center frequencies 312 may not have outside edges of outer subbands 35 aligned with a target output bandwidth 310 outer edges. Accordingly, such a conventional partitioned spectra 30 may not be sufficiently granular for a multirate application for a PR.

However, a merged output 204 of alternating bands of different bandwidths, such as wider bands 320 and narrower bands 330, may have outside edges of outer subbands 330 or 320 aligned with a target output bandwidth 310 outer edges. Generally, such granularity may be provided by adjusting an amount generally denoted as $\beta$ for alignment of outer edges of outer subbands. Accordingly, crossovers 311 may be shifted away from midpoint crossovers 31; however, center frequencies 312 of subbands of output signals 109 ("interleaved output 109") and 204 ("merged output 204"), as well as a conventional spectra 30 of FIG. 3 for purposes of comparison, do not change.

For alignment of outer edges of outer bands of a span of bands, which may form a time series in the time domain, bands beyond aligned outer bands may be punctured or masked, as generally indicated with Xs 238 in interleaved output signal 108. Accordingly, at least one selected component 238 of an interleaved output signal 108 at baseband, as well as a corresponding interleaved output 109, may be masked with a mask 138, which may be a binary mask for example. Outer edges of outer bands, which in this example are outer narrower subbands 330, of interleaved output 109 are aligned to outer edges of a passband or bandwidth 310 of output signal 139.

In this implementation, adjacent complementary bandwidth channels respectively output from PFs 112 and 122 may have equal input and output length prototype filters. In other words, there may be P path inputs and P path outputs for each of PFs 112 and 122. PFs 112 and 122, namely dual analysis filter banks with PF 112 having narrower bandwidth channel filters and PF 122 having wider bandwidth channel filters, may be windowed by a same time domain window. Both narrower and wider bandwidth channel filters may be Nyquist filters. More particularly, Nyquist filter banks may be configured to preserve spectral information for a Perfect Reconstruction property. Along those lines, PFs 112 and 122 may include respective polyphase filter banks. Subbands 320 and 330 of interleaved output 109 may be used to provide a reconstructed sum to provide output signal 139 with a bandwidth 310. In the example herein, subbands 320 are even subbands, and subbands 330 are odd subbands; however, in another implementation even and odd subbands for narrower and wider subbands may be reversed. Moreover, in another implementation, outermost bands of an interleaved output 109 may be wider subbands 320.

In examples described herein, channelizers 110 and 210 may each have two sets of interleaved complementary bandwidth channels. However, in other implementations, channelizers with more than two different bands, namely channelizers with three or more different bandwidth interleaved channels, may be implemented in accordance with the description herein by scaling up at least the number of path filters to provide three or more different bandwidths for channel filter banks.

Channelizer 110 includes IFFT blocks 113 and 123 respectively for receiving channelized subintervals or filtered samples 102 and 103 for transforming into constituent narrowband time signals. Channelizer 210 includes a merge block 212 for receiving channelized subintervals or filtered samples 102 and 103 and includes an IFFT block 213 for receiving a merged output 204 from merge block 212 for transforming into narrowband time signals. In the frequency domain, filtered samples 102 and 103 may be thought of as subband signals.

With reference to channelizer 110, components of channelized filtered samples 102 and 103 respectively output from PFs 112 and 122 may be respectively input to IFFTs 113 and 123. Inputs and outputs of PFs 112 and 122 may be P paths or indices long, and inputs and outputs of IFFTs 113 and 123 may likewise be P paths long. IFFT 113 may output narrowband time outputs 104 for narrower bandwidth filtered samples, and IFFT 123 may output narrowband time outputs 105 for wider bandwidth filtered samples.

In this example, a set of even indexed channel bin outputs 106, namely a subset of narrowband time outputs 104, and a set of odd indexed channel bin outputs 107, namely a subset of narrowband time outputs 105, may be interleaved with one another to provide a P path interleaved output 108 from analysis block 140 of channelizer 110. Interleaved output 108 from analysis block 140 may be input to a synthesis block 150 of a channelizer 130 cascaded with channelizer 110 of variable bandwidth filter 100, as described below in additional detail.

In an FPGA or other programmably configurable implementation, channelizer 110 may be coupled to channelizer 130 via programmable wiring to provide a binary mask 138 to provide interleaving of outputs 106 and 107. Optionally, dedicated wiring may be used to provide a binary mask 138. For example, an ASIC or other form of IC may use dedicated wiring to provide a binary mask 138. Optionally, binary mask 138 may be realized by placing a multiplexor in front of each input port to IFFT 131, where one input to such multiplexor may be wired to a logic 0 and another input to such multiplexer may be wired to either an output from IFFT 113 or IFFT 123. In this configuration, a multiplexer control select signal may be used to mask out or allow passage of a channel. Binary mask 138 may be included as part of channelizer 110.

One or more time intervals, namely one or more frequency components, associated with narrowband time outputs 104 and/or 105 may be punctured or masked, as generally indicated by an X 238 in this example, using programmable wiring to provide a binary mask 138. However, in other implementations, such puncture X may be implemented with dedicated wiring and/or multiplexed inputs. Moreover, in another example, to narrow an output bandwidth of output signal 139 of variable bandwidth filter 100 in comparison to input bandwidth 142, a topmost band and a bottom-most band of interleaved output 108 may be punctured or masked, namely not connected to, selectively blocked, or programmably blocked from IFFT 131. Moreover, puncturing/masking of one or more bands is not limited to outermost bands, but may include one or more interior bands with respect to such topmost and bottom-most bands and/or a combination thereof. An example of puncturing/masking is described in additional detail with reference to FIG. 2.

With reference to channelizer 210, a combiner or merge block 212 may be coupled for receiving channelized filtered samples 102 and 103. Merge block 212 may be configured for merging channelized filtered samples 102 with channelized filtered samples 103 for providing a merged output 204 from merge block 212. Merged output 204 may have spectral information corresponding to passband 141. For example, merged output 204 may have a same overall bandwidth as that of bandwidth 142.

For this implementation of two bands of different bandwidths, where information from alternate bands respectively from PFs 112 and 122 is used, merged output 204 may be P paths long or wide. Along those lines, as alternate bins from two P path length PF outputs of filtered samples 102 and 103 are used, then if P is an even number, outputs of PFs 112 and 122 may be processed by merge block 212 to form sums and differences of butterfly segments, namely a butterfly merge block in this example, to couple a single P path length IFFT block 213 with interleaved channel filter outputs. Accordingly, merge block 212 may include a set of P/2 butterfly combiners (known as "butterflies") to merge P outputs from each of PFs 112 and 122 to provide a P long merged or combined output 204 representing an interleaving of narrower and wider bands of outputs 102 and 103.

In this example, outputs of even indexed channel bins from filtered samples 102 and outputs of odd indexed channel bins from filtered samples 103 may be butterfly merged with one another by merge block 212 to provide merged output 204 to IFFT block 213. IFFT block 213, which may have a P path long input, may be coupled to receive merged output 204 for transforming merged output 204 into narrowband time signals as interleaved output 108.

Along those lines, IFFT block 213 may downsample merged output 204 to provide downsampled samples as narrowband time signals aliased to a baseband as interleaved output 108. Even though bandwidth 142 may be a wideband digital signal, alternating bands of different bandwidths of merged output 204 are narrowbands for such down sampling. Likewise, narrowband time signals of alternating narrower and wider bands of interleaved output 108 are narrowbands for upsampling. In this example, M/2 and 2M downsampling and upsampling are used; however, in other examples other factors for downsampling and upsampling may be used.

IFFT 213 may downsample for aliasing to a baseband such P-n narrowband time signals of interleaved output 108. IFFT 213 may further provide phase coherence sums for canceling unwanted aliasing occurring in downsampling while allowing aliasing to baseband each of such P-n narrowband time signals. IFFTs 113 and 123 may perform similar downsampling and canceling operations for aliasing to baseband as does IFFT 213.

In an FPGA or other programmably configurable implementation, channelizer 210 may be coupled to channelizer 130 via programmable wiring to provide a binary mask 138 to provide in this example puncturing of outputs of IFFT 213. Optionally, dedicated wiring, such as of an ASIC or other IC, may be used to provide a binary mask 138. Binary mask 138 may be included as part of channelizer 210.

One or more time intervals, namely one or more frequency components, of narrowband time signals of interleaved output 108 may be punctured using programmable wiring to provide a binary mask 138, as generally indicated by Xs 238 in this example. In this example, to narrow an output bandwidth of output signal 139 of variable bandwidth filter 200 in comparison to input bandwidth 142, a topmost band and a bottom-most band of interleaved output 108 may be punctured, namely not connected to IFFT 131, as generally indicated by top and bottom Xs 238. Moreover, puncturing of one or more bands is not limited to outermost bands, but may include one or more interior bands with respect to such topmost and bottom-most bands. Thus, even though IFFTs 213 and 131 both have P-path inputs and P-path outputs, not all of such P-path outputs of IFFT 213 and correspondingly not all of such P-path inputs of IFFT 131 may be respectively coupled to one another.

An input channelizer 110 or 210 may be coupled to an output channelizer 130. Channelizer 130 may include a synthesis filter or synthesis filter bank ("synthesis block") 150 and an output commutator 133. Synthesis block 150 may include an IFFT 131 and a PF 132. IFFT 131 and PF 132 may both have P-path inputs and P-path outputs. A combination of an analysis filter, such as either analysis block 140 or 240, a mask 138, and a synthesis filter, such as synthesis block 150, may be used to provide a variable bandwidth analysis-synthesis filter 199.

IFFT 131 may receive P-n narrowband time signals or downsampled samples of interleaved output 108, for n a positive integer indicating a number of punctures, if any, by a binary mask 138 to adjust bandwidth of an input bandwidth for providing an output signal 139. IFFT 131 may provide P upsampled samples or narrowband time signals to provide an interleaved output 109 for such P-n downsampled samples of interleaved output 108. IFFT 131 may alias such P-n narrowband time signals of interleaved output 108 each in their baseband frequency bin to provide an interleaved output 109 of alternating narrower and wider bands spaced apart from one another at equal frequency distances with respect to corresponding center frequencies.

For synthesis or reconstruction, IFFT 131 may upsample narrowband time signals of interleaved output 108 for aliasing to spectral intervals for providing interleaved output 109. In this example, interleaved output 109 may be thought of alternating intervals corresponding to alternating narrower and wider bands with equally spaced center frequencies. Narrowband time signals of interleaved output 109 may be used for a reconstruction of selected components of input signal 101 for providing an output bandwidth of an output signal 139 which is narrower than bandwidth 142 of input signal 101. IFFT 131 may provide phase coherence sums for canceling unwanted aliasing occurring in upsampling while allowing aliasing to center frequencies respectively of spectral intervals for each of narrowband time signals of interleaved output 109.

A PF 132 may be coupled to receive upsampled samples of interleaved output 109 for providing filtered upsampled samples 135. PF 132 may be an output polyphase filter bank for receiving channelized narrowband time signals of interleaved output 109 for respective filtering thereof for providing filtered spectral intervals, generally filtered upsampled samples, 135 corresponding thereto.

Filtered upsampled samples 135 may be received and commutated by an output commutator 133. Commutator 133 may commutate filtered upsampled samples 135 to an adder 134, internal or external to commutator 133, where a sampling window is used for such commutation. Adder 134 may add commutated filtered upsampled samples for providing an interleaved sum or output signal 139 with an output bandwidth. Again, such an output bandwidth may be narrower than an input bandwidth, such as for a multirate signal processing application.

Analysis block 240, as well as analysis block 140, may include a non-maximally decimated filter, such as a non-maximally decimated analysis filter bank. Likewise, synthesis block 150 may include a non-maximally decimated filter, such as a non-maximally decimated synthesis filter bank. Analysis and synthesis blocks hereof may be used for wideband, as well as extremely wide bandwidth, digital signals. For extremely wideband digital signals, samples may be collected or taken at a sample rate of 3 GHz or higher. Along those lines, input commutator 111 and output commutator 133 may operate at the same multiple GHz output sample rate for example.

To recapitulate, a P-path analysis channelizer 110 or 210 may commutate an input signal to multiple P-path PFs of different bandwidths. IFFTs or a single IFFT respectively of P-path analysis channelizer 110 or 210 may be used to provide an interleaved output. For example, a P-path analysis channelizer with a sample rate of f may partition a wideband input signal into P baseband time signals with bandwidths of 2 f/M after downsampling. By increasing a sample rate to 2 f/M for example rather than f/M means that channelized Nyquist filters may not exhibit transition band aliasing at their band edges. Accordingly, non-maximally decimated filter banks may be used for a PR of an input spectrum from P-path filter bank outputs. A binary mask may be used to select a subset of a channelized time series output by such a P-path analysis channelizer 110 or 210 for input to a synthesis channelizer 130 for variable bandwidth filtering. Such synthesis channelizer 130 up-samples and up-converts such selected multiple streams or channelized time series to synthesize a reduced bandwidth output time series. A binary mask coupling analysis and synthesis filter banks may synthesize filters with bandwidths of kf/M for k an integer greater than 0. For non-integer values of k, conventional additional processing of low-bandwidth signal components between analysis and synthesis filter banks may be added to synthesize such fractional filter bandwidths for non-integer multiples of a channel width; however, this may add delay into the signal processing filter chain.

In accordance with the above-description, variable bandwidth filters 100 and 200 may be used for variable bandwidth filtering for digital signal processing applications, including without limitation wide bandwidth filtering. PR non-maximally decimated analysis blocks 140 and 240 and synthesis block 150, which may be implemented with polyphase filter banks, may be used to interleave filtered samples of different bandwidths to provide variable bandwidth filters 100 and 200. Along those lines, when combined with programmable configurable hardware, multi-resolution wideband software-defined radios may be implemented for example. However, generally, a variable bandwidth filter as described herein may be used for any signal processing application, and in particular application having filtering tasks where a reduction in processing power and/or circuitry overhead is useful.

Figure 4:
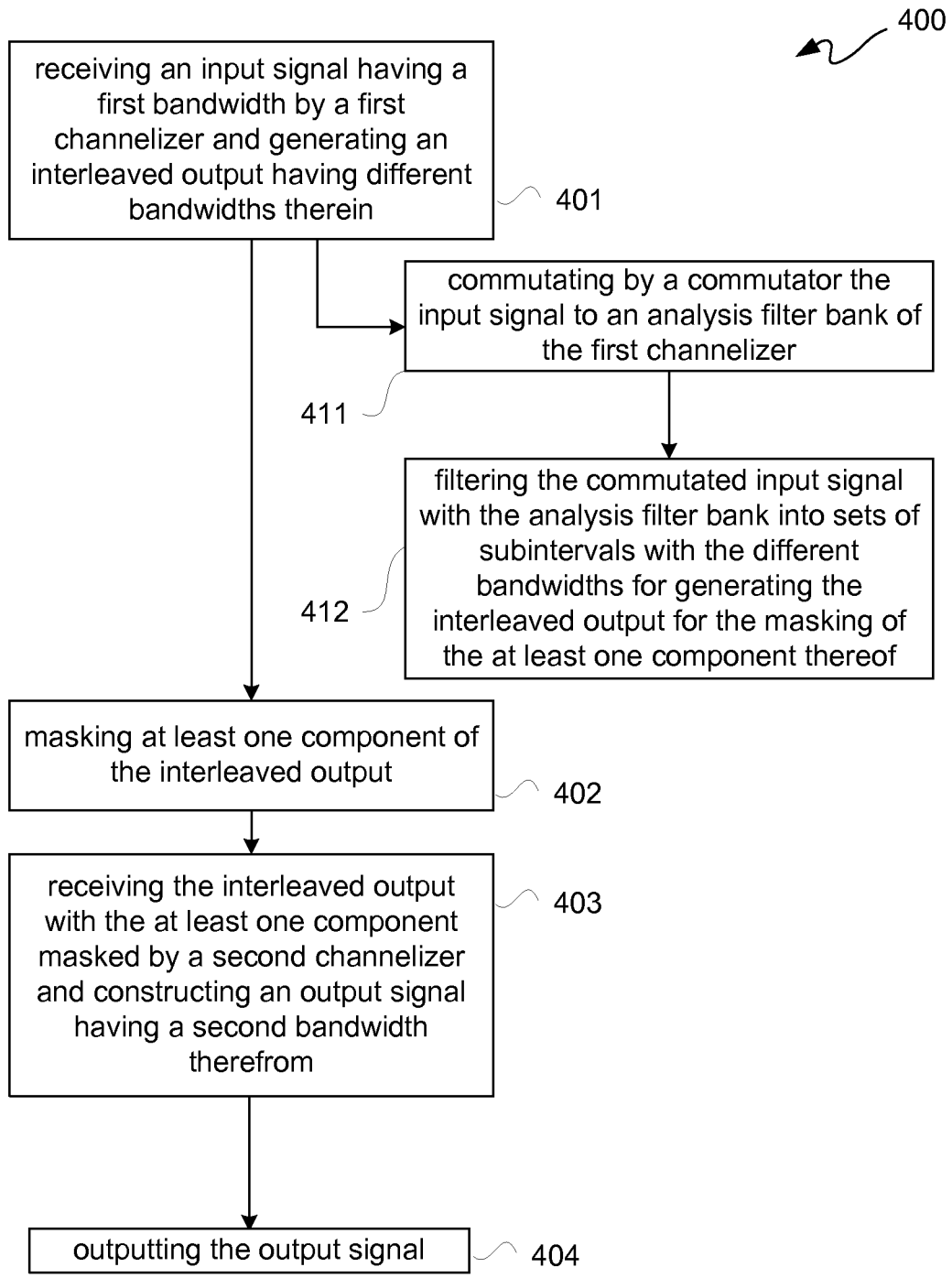
FIG. 4 is a flow diagram depicting an exemplary signal processing flow.

FIG. 4 is a flow diagram depicting an exemplary signal processing flow 400 in accordance with the above description. Along those lines, signal processing flow 400 is further described with simultaneous reference to FIGS. 1 through 4.

At 401, an input signal 101 may be received by first channelizer 110 or 210 for generating an interleaved output 108 having different bandwidths therein. Again, input signal 101 has a first bandwidth 142, which may be for a wideband signal.

At 402, at least one selected component 238 of interleaved output 108 may be masked with a mask 138. Again, mask 138 may be a binary mask.

At 403, interleaved output 108 with the at least one selected component 238 masked may be received by a second channelizer 130 for constructing an output signal 139 therefrom. Accordingly, a first channelizer 110 or 210 may be an input channelizer and a second channelizer 130 may be an output channelizer in a cascade of first and second channelizers.

Output signal 139 may have a second or output bandwidth 310 different from a first or input bandwidth 142. At 404, output signal 139 may be output from a variable bandwidth filter 100 or 200.

Operation of first channelizer 110 or 210 at 401 may include operations at 411 and 412. At 411, an input commutator 111 may commutate input signal 101 to an analysis filter 140 or 240 respectively of first channelizer 110 or 210. At 412, input signal 101 commutated may be filtered with an analysis filter 140 or 240 into sets of subintervals with different bandwidths for providing an interleaved output 108 for masking of at least one selected component 238 thereof with a mask 138.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 5:
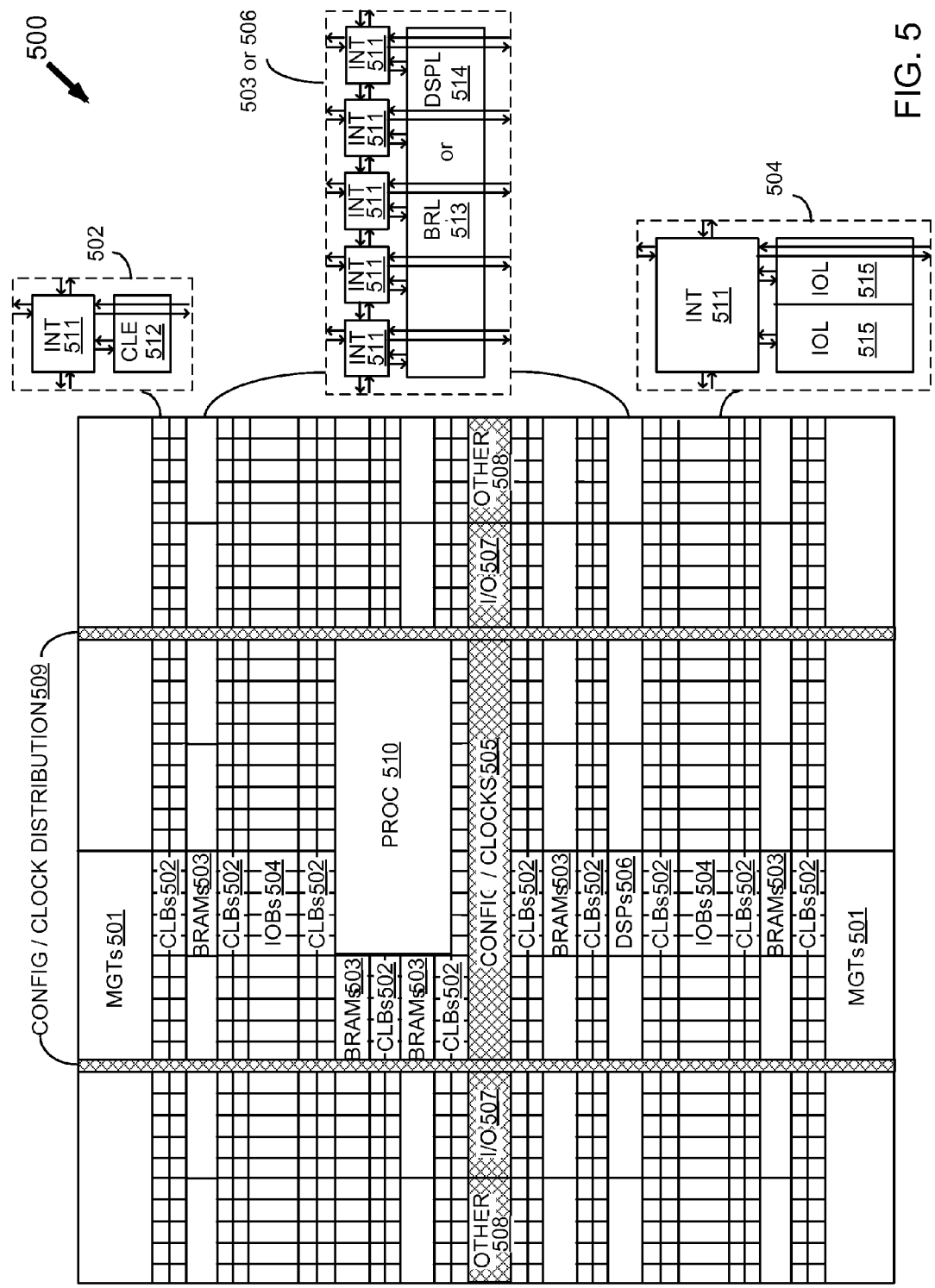
FIG. 5 is a simplified block diagram depicting an exemplary columnar Field Programmable Gate Array ("FPGA") architecture.

As noted above, advanced FPGAs can include several different types of programmable logic blocks in the array. For example, FIG. 5 illustrates an FPGA architecture 500 that includes a large number of different programmable tiles including multi-gigabit transceivers ("MGTs") 501, configurable logic blocks ("CLBs") 502, random access memory blocks ("BRAMs") 503, input/output blocks ("IOBs") 504, configuration and clocking logic ("CONFIG/CLOCKS") 505, digital signal processing blocks ("DSPs") 506, specialized input/output blocks ("I/O") 507 (e.g., configuration ports and clock ports), and other programmable logic 508 such as digital clock managers, analog-to-digital converters, system monitoring logic, and so forth. Some FPGAs also include dedicated processor blocks ("PROC") 510.

In some FPGAs, each programmable tile includes a programmable interconnect element ("INT") 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 can include a configurable logic element ("CLE") 512 that can be programmed to implement user logic plus a single programmable interconnect element ("INT") 511. A BRAM 503 can include a BRAM logic element ("BRL") 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element ("DSPL") 514 in addition to an appropriate number of programmable interconnect elements. An IOB 504 can include, for example, two instances of an input/output logic element ("IOL") 515 in addition to one instance of the programmable interconnect element 511. As will be clear to those of skill in the art, the actual I/O pads connected, for example, to the I/O logic element 515 typically are not confined to the area of the input/output logic element 515.

In the pictured embodiment, a horizontal area near the center of the die (shown in FIG. 5) is used for configuration, clock, and other control logic. Vertical columns 509 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 510 spans several columns of CLBs and BRAMs.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for variable bandwidth filtering, comprising:
   an analysis filter bank having path filters associated with different bandwidths and configured for filtering and transforming an input signal having a first bandwidth into a first interleaved output,
      wherein the first interleaved output includes a plurality of narrowband time signals having bands with alternating first width and second width different from the first width;

a mask coupled to the analysis filter bank and configured for masking at least one narrowband time signal of the first interleaved output;

a synthesis filter bank coupled to the mask and configured for transforming and filtering the masked first interleaved output to generate a second interleaved output for constructing an output signal having a second bandwidth; and wherein the second bandwidth is different than the first bandwidth for the variable bandwidth filtering.

2. The apparatus according to claim 1, wherein the analysis filter bank is configured for merging sets of subintervals respectively output from the path filters for generating a merged output.

3. The apparatus according to claim 2, wherein the analysis filter bank is configured for performing an Inverse Fourier Transform on the merged output for downsampling thereof to a baseband to provide the first interleaved output.

4. The apparatus according to claim 3, wherein the analysis filter bank comprises:
a plurality of polyphase filter banks for the path filters for filtering the input signal into the sets of subintervals;
a butterfly merge block coupled to the plurality of polyphase filter banks and configured for merging the sets of subintervals for generating the merged output;
an Inverse Fast Fourier Transform block coupled to the butterfly merge block and configured for downsampling the merged output to the baseband for generating the first interleaved output; and
each of the sets of subintervals and the merged output is respectively P paths long for P a positive integer.

5. The apparatus according to claim 3, wherein the synthesis filter bank is configured for performing an Inverse Fourier Transform on the masked first interleaved output for upsampling into constituent narrowband time signals at equally-spaced apart center frequencies for subbands of the different bandwidths for generating the second interleaved output.

6. The apparatus according to claim 5, wherein the synthesis filter bank comprises:
an Inverse Fast Fourier Transform block configured for upsampling the masked first interleaved output into the constituent narrowband time signals for providing the second interleaved output; and
a polyphase filter bank coupled to the Inverse Fast Fourier Transform block and configured for respectively filtering channelized components of the second interleaved output.

7. The apparatus according to claim 1, wherein:
the analysis filter bank is configured for respectively performing Inverse Fourier Transforms on sets of subintervals from the path filters for providing corresponding sets of narrowband time outputs respectively associated with the different bandwidths;
the mask is coupled to the analysis filter bank and configured for interleaving the sets of narrowband time outputs for generating the first interleaved output with the at least one narrowband time signal of the first interleaved output being masked; and
each of the sets of subintervals and the sets of narrowband time outputs is respectively P paths long for P a positive integer.

8. The apparatus according to claim 1, wherein the analysis filter bank and the synthesis filter bank respectively are a non-maximally decimated analysis filter bank and a non-maximally decimated synthesis filter bank.

9. An apparatus for variable bandwidth filtering, comprising:
a first channelizer configured for receiving an input signal having a first bandwidth and configured for filtering and transforming the input signal for generating an interleaved output with at least one component thereof masked;
the interleaved output including a plurality of narrowband time signals having bands with alternating first width and second width different from the first width;
a second channelizer cascaded with the first channelizer and configured for transforming and filtering the masked interleaved output and constructing an output signal therefrom; and
wherein the output signal has a second bandwidth different from the first bandwidth for the variable bandwidth filtering.

10. The apparatus according to claim 9, wherein the first channelizer comprises:
an input commutator coupled to an analysis filter bank;
the input commutator configured for commutating the input signal to the analysis filter bank; and
the analysis filter bank configured for filtering the commutated input signal into sets of subintervals with the different bandwidths for generating the interleaved output.

11. The apparatus according to claim 10, wherein the analysis filter bank comprises:
a plurality of path filters having the different bandwidths from one another coupled to the input commutator and configured for filtering the commutated input signal for respectively generating the sets of subintervals with the different bandwidths;
a merge block coupled to the plurality of path filters and configured for merging the sets of subintervals into a merged output;
a first Inverse Fourier Transform block coupled to the merge block and configured for transforming the merged output for generating the interleaved output; and
a mask coupled to the first Inverse Fourier Transform block and configured for masking at least one subinterval as the at least one component of the interleaved output.

12. The apparatus according to claim 11, wherein the second channelizer comprises:
a synthesis filter bank coupled to the mask and configured for transforming and filtering the masked interleaved output for generating filtered samples; and
an output commutator coupled to the synthesis filter bank and configured for commutating the filtered samples to a combiner of the output commutator for constructing the output signal.

13. The apparatus according to claim 12, wherein the interleaved output is a first interleaved output, and wherein the synthesis filter bank comprises:
a second Inverse Fourier Transform block coupled to the mask and configured for transforming the masked interleaved output into a second interleaved output; and
a path filter coupled to the second Inverse Fourier Transform block and configured for filtering the second interleaved output for generating the filtered samples for channelized components of the second interleaved output.

14. The apparatus according to claim 13, wherein the input commutator and the output commutator have a same sample rate.

15. The apparatus according to claim 13, wherein the analysis filter bank and the synthesis filter bank respectively are a non-maximally decimated analysis filter bank and a non-maximally decimated synthesis filter bank.

16. The apparatus according to claim 13, wherein:
the first Inverse Fourier Transform block is configured for downsampling the merged output for generating the first interleaved output at baseband for masking with the mask; and
the second Inverse Fourier Transform block is configured for upsampling the masked interleaved output for generating the second interleaved output.

17. The apparatus according to claim 16, wherein:
the input commutator and the output commutator have a same output sample rate; and
the output signal is a Perfect Reconstruction for the output sample rate.

18. The apparatus according to claim 16, wherein the plurality of path filters and the path filter are respective instances of prototype filters each having equal input and output lengths.

19. A method for variable bandwidth filtering, comprising:
receiving an input signal having a first bandwidth by a first channelizer and generating an interleaved output including a plurality of narrowband time signals having bands with alternating first width and second width different from the first width;
masking at least one component of the interleaved output;
receiving the interleaved output with the at least one component masked by a second channelizer and constructing an output signal having a second bandwidth therefrom;
wherein the second bandwidth is different from the first bandwidth; and
outputting the output signal.

20. The method according to claim 19, wherein operation of the first channelizer comprises:
commutating by a commutator the input signal to an analysis filter bank of the first channelizer; and
filtering the commutated input signal with the analysis filter bank into sets of subintervals with the different bandwidths for generating the interleaved output for the masking of the at least one component thereof.

* * * * *